United States Patent
Chiou et al.

(10) Patent No.: US 7,232,362 B2
(45) Date of Patent: Jun. 19, 2007

(54) CHEMICAL MECHANICAL POLISHING PROCESS FOR MANUFACTURING SEMICONDUCTOR DEVICES

(75) Inventors: Wen-Chih Chiou, Miaoli (TW); Ying-Ho Chen, Taipei (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 140 days.

(21) Appl. No.: 10/964,145

(22) Filed: Oct. 12, 2004

(65) Prior Publication Data
US 2006/0079154 A1 Apr. 13, 2006

(51) Int. Cl.
*B24B 1/00* (2006.01)
(52) U.S. Cl. ........................................ 451/28
(58) Field of Classification Search ........... 438/687, 438/629; 451/28, 36, 41, 57, 59
See application file for complete search history.

(56) References Cited

U.S. PATENT DOCUMENTS

| | | | |
|---|---|---|---|
| 6,274,475 B1 | 8/2001 | Farkas et al. | |
| 6,524,959 B1 | 2/2003 | Lu et al. | |
| 6,573,173 B2 | 6/2003 | Farkas et al. | |
| 6,830,504 B1 * | 12/2004 | Chen et al. | 451/57 |
| 2004/0074518 A1 * | 4/2004 | Korthuis et al. | 134/1.3 |
| 2004/0266183 A1 * | 12/2004 | Miller et al. | 438/687 |
| 2005/0016861 A1 * | 1/2005 | Laursen et al. | 205/222 |
| 2005/0090104 A1 * | 4/2005 | Yang et al. | 438/689 |

* cited by examiner

*Primary Examiner*—Jacob K. Ackun, Jr.
(74) *Attorney, Agent, or Firm*—Haynes and Boone, LLP (57) ABSTRACT

A chemical-mechanical polishing (CMP) process for the manufacturing of semiconductor devices is disclosed. The process includes removing a first portion of a first layer of interconnect materials using a first platen and a first slurry, removing a second portion of the first layer using a second platen and a second slurry, removing a first portion of a second layer of the interconnect materials using a second platen and a third slurry, and removing a second portion of the second layer using a third platen and a fourth slurry.

20 Claims, 6 Drawing Sheets

CHEMICAL MECHANICAL POLISHING PROCESS FOR MANUFACTURING SEMICONDUCTOR DEVICES

BACKGROUND

The present disclosure relates generally to the manufacturing of semiconductor devices, and more particularly to a chemical-mechanical polishing (CMP) process utilized in semiconductor manufacturing.

The semiconductor integrated circuit (IC) industry has experienced rapid growth. Technological advances in IC materials and design have produced generations of ICs where each generation has smaller feature sizes and more complex circuits than those from the previous generation.

With the increased number of interconnect layers in a given IC, traditional planarizing techniques, such as sacrificial-resist etchback, thermal flow, and spin-on glass, have become inadequate to achieve the required planarization of metal layers. Chemical-mechanical polishing (CMP) is often used to selectively remove high elevation features by a combination of mechanical polishing and chemical reaction.

A typical system for CMP may have two or three platens, each for performing a separate CMP process. A wafer is mounted on a rotating carrier, the carrier and wafer sequentially moves to each of the platens, and a CMP process is performed at each platen. Typically, an abrasive-containing aqueous slurry is provided during CMP to facilitate the process.

In a more specific example, CMP for a copper interconnect typically employs three steps: polishing the copper (Cu) on the first platen, polishing tantalum nitride (TaN) on a second platen, and then perform oxide buffing on a third platen. However, this process creates bottlenecks, such as on the third platen, and therefore results in higher manufacturing cost.

What is desired is a new and improved system and method for enhancing the CMP process and/or improving the manufacturing throughput through the CMP process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1A:
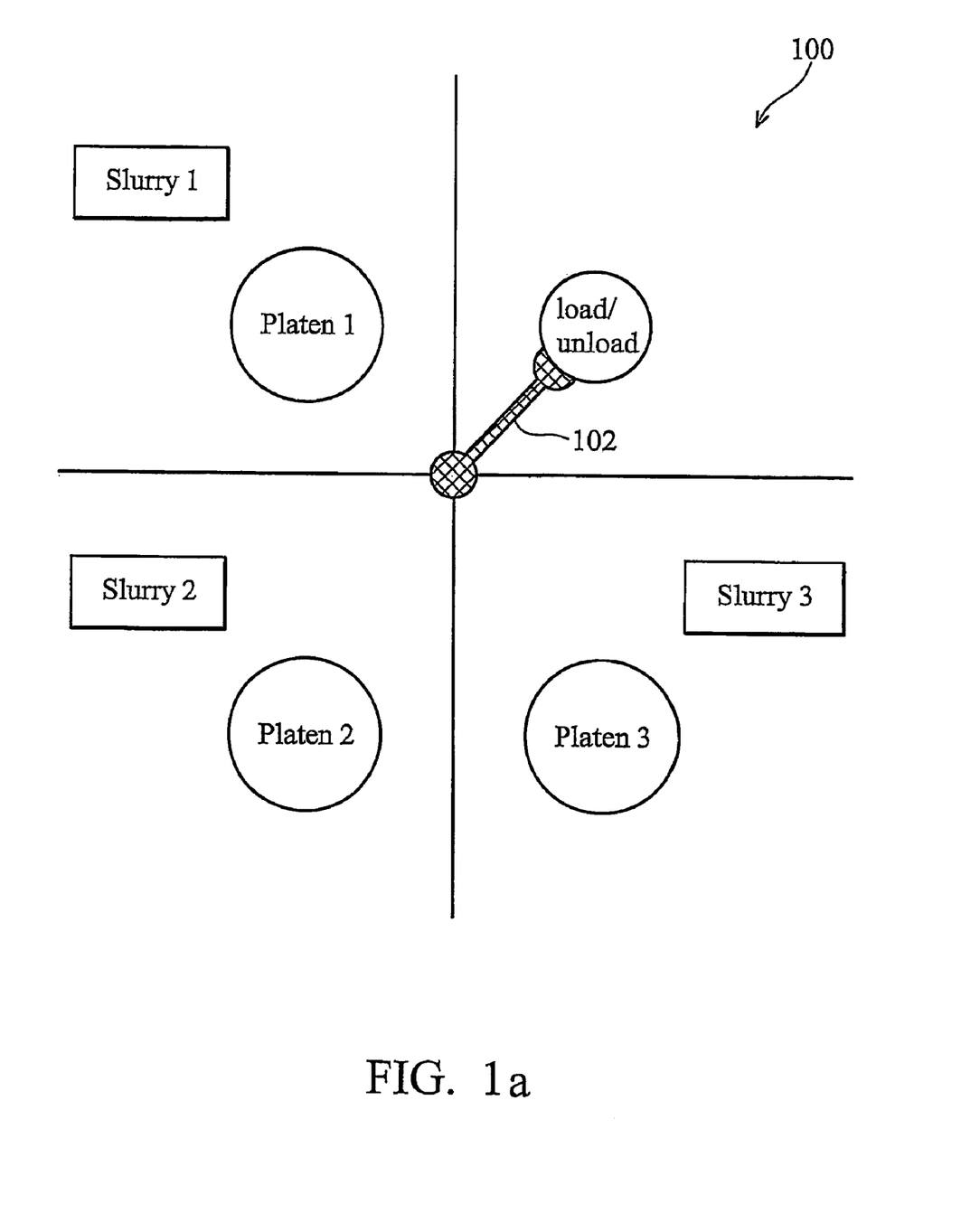
FIG. 1a is a block diagram of a CMP system for implementing one or more embodiments of the present invention.

Referring now to FIG. 1a, shown therein is an exemplary CMP rotary polisher system 100, similar in part to the AMAT Reflexion/MESA system sold by the Applied Materials Corporation. The system 100 is a four-station system, with one station being used for loading and unloading and the other three stations including a platen (Platen 1, Platen 2, Platen 3) for separate CMP processing operations. A robot arm 102 can be used to transfer a substrate, such as a semiconductor wafer, from platen to platen.

Figure 1B:
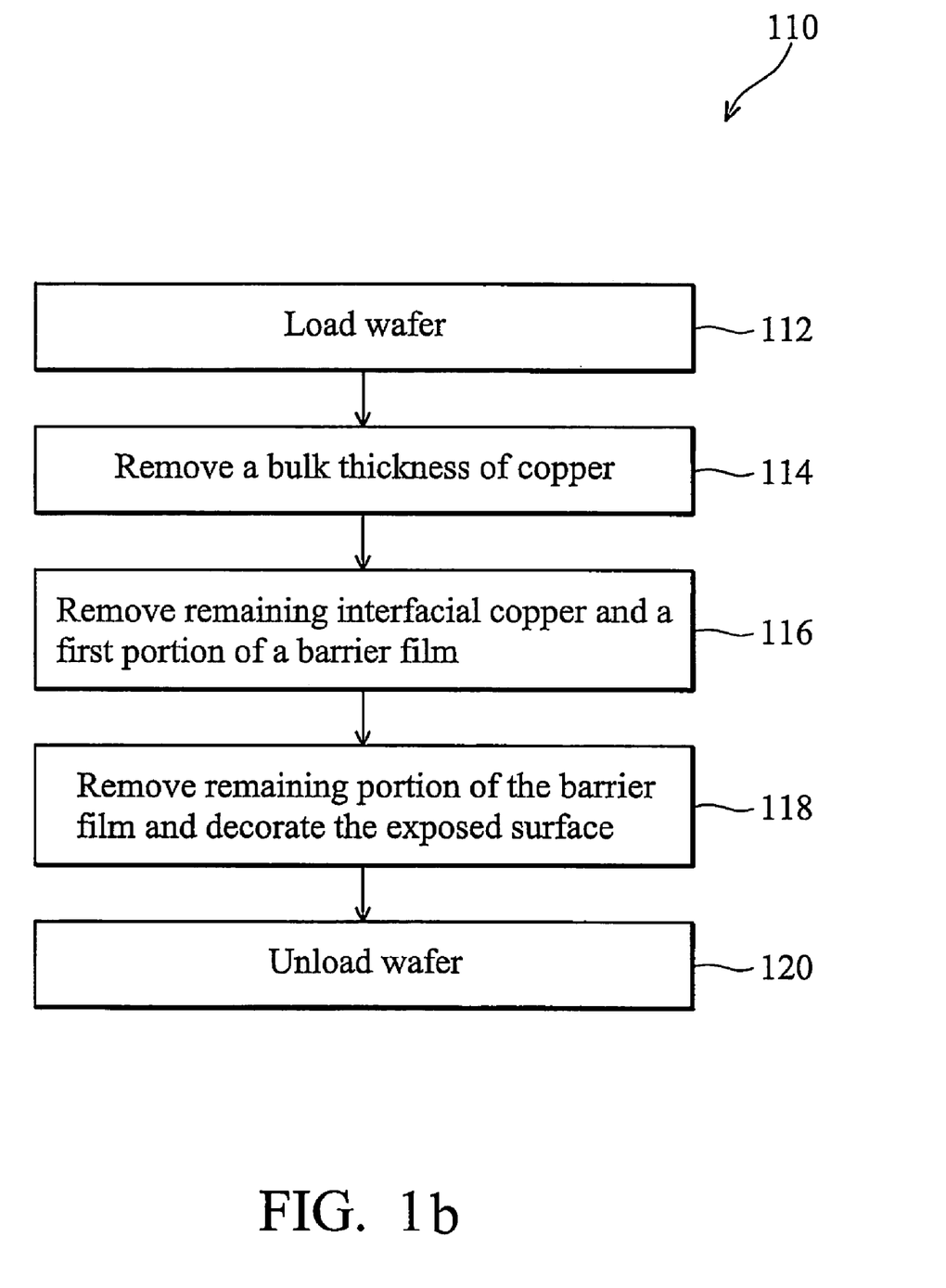
FIG. 1b is a flow chart of a method for forming a partial semiconductor device utilizing a CMP process according to one or more embodiments of the present invention.

Referring also to FIG. 1b, the system 100 (of FIG. 1a) can be used to perform an exemplary method 110 for forming a partial semiconductor device utilizing a multi-platen CMP process. The method 110 is discussed in general detail below, and then embodiments of an example semiconductor wafer being processed by the system 100 and using the method 110 are provided with respect to the remaining figures of the present disclosure.

Execution begins at step 111, where a substrate is loaded into the CMP system 100. For the sake of example, the substrate is a semiconductor wafer having a conductive layer (e.g., copper), a dielectric layer, and a barrier layer deposited thereon. The layers are arranged to form interconnect one or more devices that are either already formed on the substrate, are in the process of being formed, or will be formed at a later time.

At step 112, a bulk thickness of the metal (e.g., copper) is polished using Platen 1. A first slurry is also used in this process step. At step 114, a thin remaining interfacial portion of the metal layer is removed and a portion of the barrier layer is removed using Platen 2. A second slurry is used in this process step. In some embodiments, multiple slurries can be used. For example, a slurry can be used to remove the thin remaining interfacial portion and another slurry can be used to remove the portion of the barrier layer. At step 118, a second portion of the barrier layer is removed using Platen 3. In addition, a top surface of the exposed surface can be "decorated" by smoothing the surface to a very planar degree.

The method 110 may be utilized in the manufacturing of a variety of semiconductor devices, such as memory devices (including but not limited to a static random access memory (SRAM)), logic devices (including but not limited to a metal-oxide semiconductor field-effect transistor (MOSFET)), and/or other devices. The method 100 will be further described in connections with exemplary partial semiconductor devices depicted in FIGS. 2–6.

Figure 2:
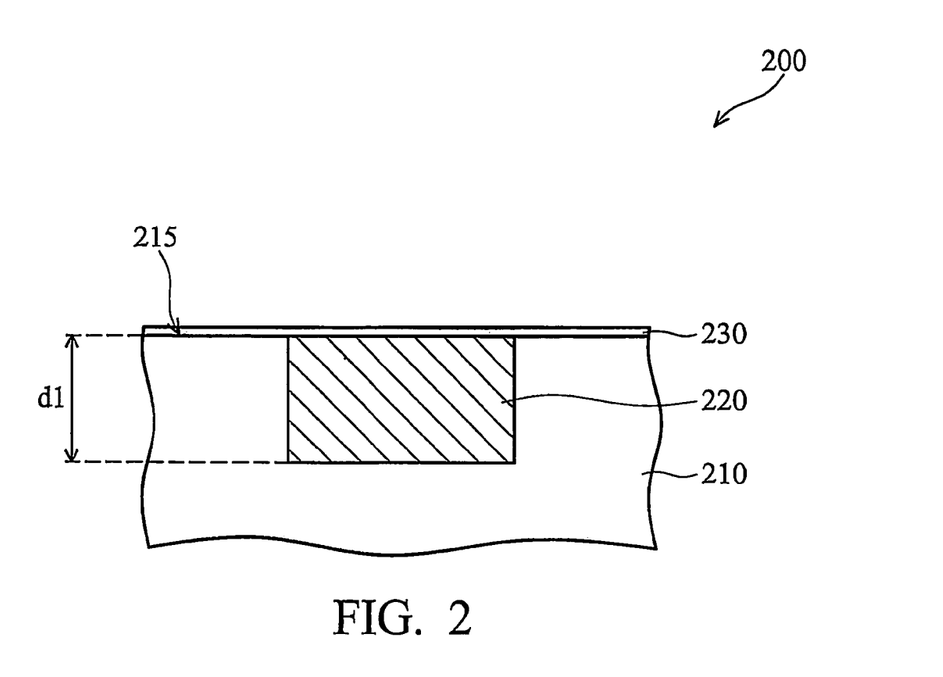
FIG. 2 is a cross-sectional view of an exemplary partial semiconductor device comprising a substrate, a conductive layer, and a dielectric layer.

Referring now to FIG. 2, an exemplary partial semiconductor device 200 includes a substrate 210. The substrate 210 may include one or more insulator, conductor, and/or semiconductor layers. For example, the substrate 210 may include an elementary semiconductor, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. Further, the substrate 210 may include a bulk semiconductor, such as bulk silicon, and such a bulk semiconductor may include an epi silicon layer. It may also or alternatively include a semiconductor-on-insulator substrate, such as a silicon-on-insulator (SOI) substrate, or a thin-film transistor (TFT) substrate. The substrate 210 may also or alternatively include a multiple silicon structure or a multilayer compound semiconductor structure.

A conductive layer 220 is deposited in a recess formed in the substrate 210 by chemical vapor deposition (CVD), plasma-enhanced CVD (PECVD), physical vapor deposition (PVD), ionized PVD (I-PVD), atomic layer deposition (ALD), plating, and/or other processes. Chemical-mechanical planarization and/or chemical-mechanical polishing may also be employed during the formation of the conductive layer 220. For example, the conductive layer 220 may be planarized so that it becomes substantially coplanar with a surface 215 of the substrate 210, as shown in FIG. 2. In another embodiment, planarization of the conductive layer 220 may be less extensive, so that the conductive layer 220 may at least partially extend from the substrate 210 to above the surface 215. Characterizations herein of the conductive layer 220 as being formed in the substrate 210 is intended to capture both of those embodiments, in addition to other alternative embodiments.

The conductive layer 220 may be a conductive feature connecting semiconductor devices, integrated circuit devices, integrated circuit components, and/or interconnects therein. A depth d1 of the conductive layer 220 may range between about 1500 Å and about 5000 Å. For example, in one embodiment, the depth d1 may be about 3500 Å. The conductive layer 220 may include aluminum, aluminum alloy, copper, copper alloy, tungsten, and/or other conductive materials.

The semiconductor device 200 may further include a dielectric layer 230 overlying the semiconductor substrate 210 and the conductive layer 220. The dielectric layer 230 may be an etch stop layer and/or a diffusion barrier layer, and may include one or more individual layers. The dielectric layer 230 may include silicon nitride, other dielectric materials, and/or etch stop materials.

Figure 3:
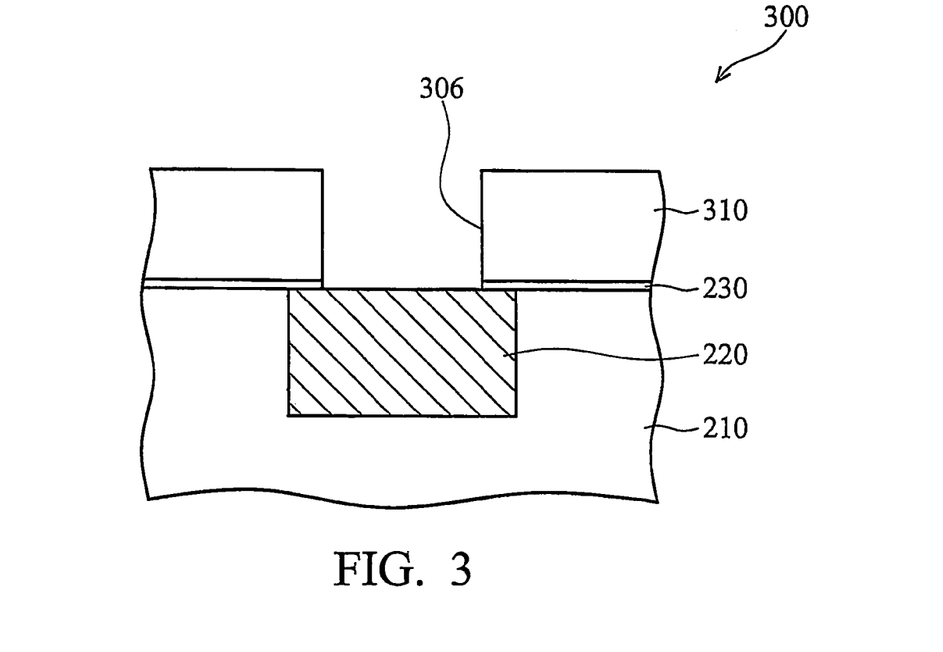
FIG. 3 is a cross-sectional view of the exemplary partial semiconductor device in FIG. 2 further comprising a second dielectric layer and an opening.

Referring now to FIG. 3, a second dielectric layer 310 may be deposited on the surface of the substrate 210 or the first dielectric layer 230. The second dielectric layer 310 may be formed by CVD, PECVD, ALD, PVD, spin-on coating and/or other processes. The second dielectric layer 310 may be an inter-metal dielectric (IMD), and may include silicon dioxide, polyimide, spin-on-glass (SOG), fluoride-doped silicate glass (FSG), Black Diamond® (a product of Applied Materials of Santa Clara, Calif.), Xerogel, Aerogel, amorphous fluorinated carbon, and/or other materials.

The second dielectric layer 310 may be patterned by photolithography, etching, and/or other means to form an opening 306, thereby exposing a portion of the underlying dielectric layer 230 or conductive layer 220. The opening 306 may be a via hole or a dual damascene opening (e.g., an opening comprising a via hole and a conductive line trench).

If necessary or desired, the exposed portion of the first dielectric layer 230 proximate the opening 306 may also be removed by dry etching and/or other processes to expose a portion of the underlying conductive layer 220. Removal of the first dielectric layer 230 may employ a process utilizing $CH_4$ as a primary gas, possibly mixed with $O_2$ and $N_2$ to adjust the etching rate and selectivity.

Figure 4:
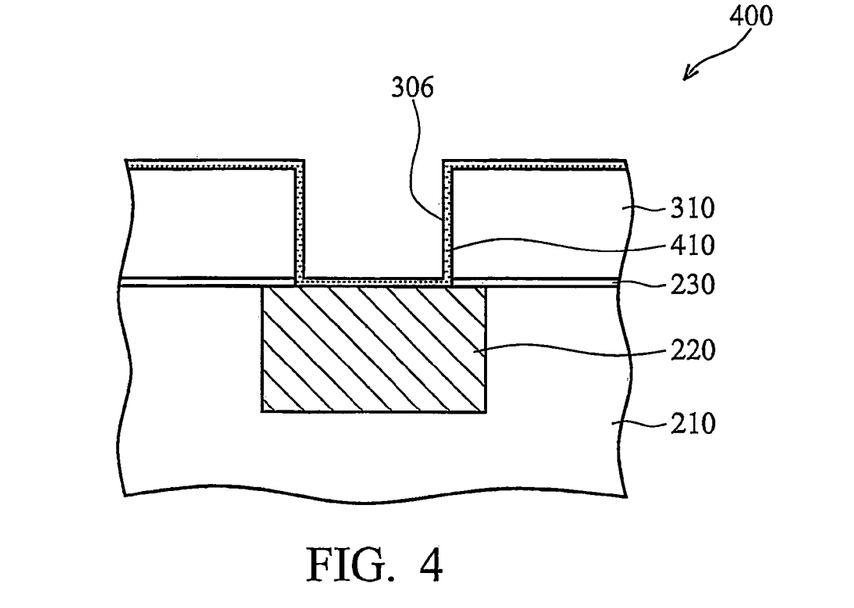
FIG. 4 is a cross-sectional view of the exemplary partial semiconductor device in FIG. 3 further comprising a barrier layer.

Referring now to FIG. 4, a diffusion barrier layer 410 may be deposited by self-ionized plasma (SIP) PVD and/or ionized metal plasma (IMP) PVD, wherein the barrier layer 410 may at least partially line the opening 306. The barrier layer 410 may include Ta, TaN, Ti, TiN, and/or other barrier materials. In one embodiment, the barrier layer 410 may be formed prior to removing a portion of the dielectric layer 230. In such an embodiment, a bottom portion of the barrier layer 410 and a portion of the first dielectric layer 230 may be sequentially removed by dry etching and/or sputtering.

In furtherance of the example, the bottom portion of the barrier layer 410 proximate the conductive layer 220, whether formed prior to or after removing a portion of the dielectric layer 230, may be removed by in-situ sputtering utilizing SIP or IMP. Consequently, at least a portion of the conductive layer 220 may be exposed.

In furtherance of the example, a second diffusion barrier layer (not shown) may be optionally deposited over the barrier layer 410. The second diffusion barrier layer may be formed in-situ by an IMP or SIP system, and may be substantially similar to the barrier layer 410 described above. For example, the second diffusion barrier layer may include Ta, TaN, Ti, TiN, and/or other barrier materials.

Figure 5:
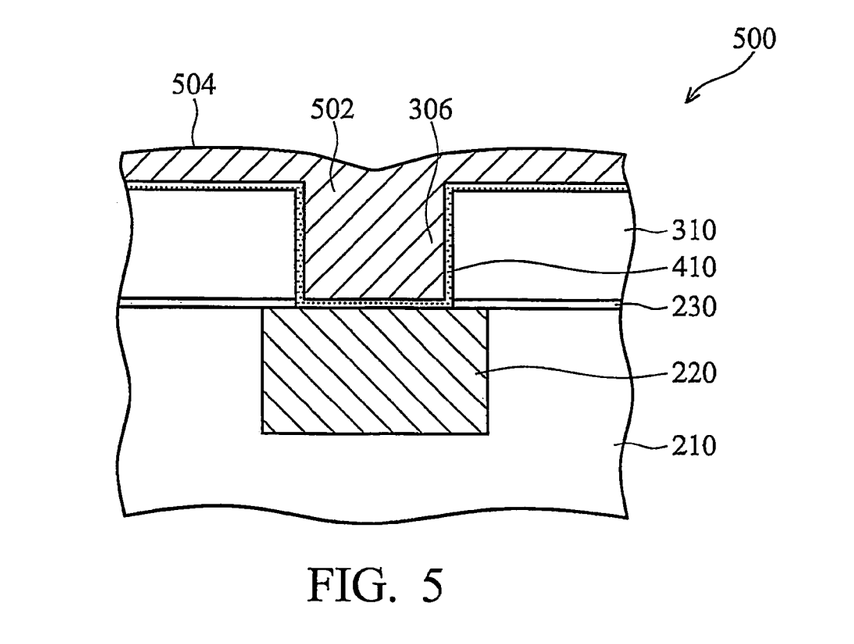
FIG. 5 is a cross-sectional view of the exemplary partial semiconductor device in FIG. 4 further comprising a conductive plug.

Referring now to FIG. 5, the opening 306 may at least partially be filled with a conductive plug 502 by damascene processing or other methods. In one embodiment, one or more seed layers comprising copper, copper alloys, and/or other seed materials may be deposited on the barrier layer 410, thereby lining the opening 306 by PVD, IMP, SIP, and/or other processes. The opening 306 may then be filled with the conductive plug 502 that may include materials substantially similar to that of the conductive layer 220. In one example, the conductive plug 502 may include copper, copper alloy, refractory metal, $TiSi_2$, $CoSi_2$, NiSi, PtSi, W, $WSi_2$, metal silicide, TiN, iW, TaN, Al, AlCu, aluminum, aluminum alloy, tungsten, and/or other suitable materials. The conductive material employed to form the conductive plug 502 may be formed in the opening 306 by electroplating and/or other deposition processes. The conductive material in the present embodiment has a top surface 504 that needs to be planarized. For purposes of this disclosure, the plug 502 and the barrier layer 410 may together be referred to herein as interconnect materials.

Figure 6:
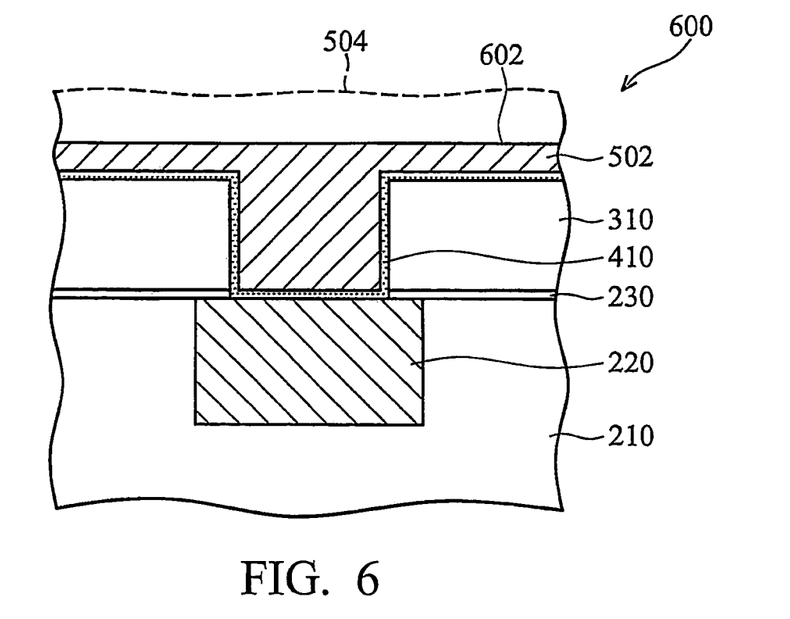
FIG. 6 is a cross-sectional view of the exemplary partial semiconductor device in FIG. 5 with a portion of the conductive plug removed.

Referring now to FIG. 6, step 114 of the method 110 is performed on the semiconductor device, herein designated with the reference numeral 600. Pursuant to step 114, a portion of the conductive plug 502, which may include Cu, may be removed on Platen 1 within the CMP system 100.

In the present example, a significant top portion 504 of the conductive plug 502 is removed at a relatively high removal rate, which may be approximately 800 Angstroms per minute. As a result, following step 114, a top surface 602 remaining on the plug 502 may be thinner than approximately 2000 Angstrom over the barrier layer 410. It is noted that other removal rates and/or remaining thickness are also contemplated herein.

The performance of step 114 may include the utilization of CMP consumables, such as slurries and polishing pads. Generally, a slurry includes small, abrasive particles of specific sizes (typically about 10 nm to 100 nm in diameters) and shapes suspended in an aqueous solution. The abrasive particles may be roughly as hard as the film that is to be polished. Acids or bases may be optionally added to the solution, depending on the material to be polished. The polishing rate may be affected by various slurry parameters, such as the chemical composition of the slurry solution, the concentration of the solid particles in the slurry, and the shape, size, and distribution of the slurry particles. An automatic slurry feeding system may be used to ensure the proper delivery of the slurry. In this embodiment, a first slurry for the first platen may include alumina, silica, or any other suitable material suspended in an aqueous solution, such as alkaline or any other suitable solution, and may include any suitable concentration known in the art. The first slurry may be procured from any commercial supplier, such as Cabot Corp. or Rode Inc.

During the performance of step 114, a polishing pressure of between roughly 0.2 pounds per inch (psi) to roughly 10 psi may be applied between the partial semiconductor device 600 and the first platen, which may have a rotational speed of between approximately 5 rotations per minute (RPM) to approximately 300 RPM. The first slurry may be distributed onto the first platen at the speed of between about 20 milliliters per minute (ml/min) to about 700 ml/min. Generally, step 114 is a timed polishing process that may last between roughly 10 seconds to roughly 5 minutes, or any other suitable duration. Alternatively, endpoint detection known in the art or as set forth in U.S. Pat. No. 6,524,959 to Lu, which is hereby incorporated by reference in its entirety, may be utilized.

Figure 7:
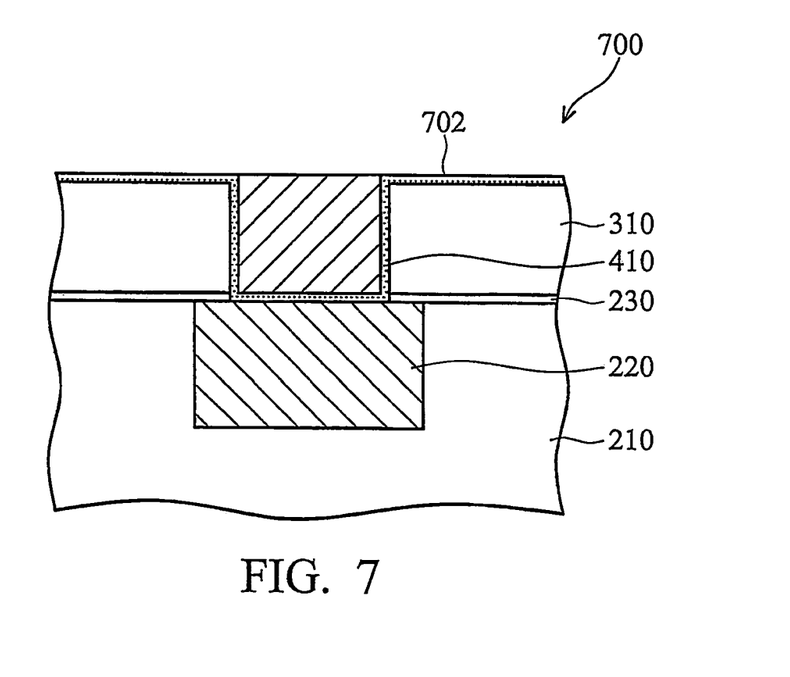
FIG. 7 is a cross-sectional view of an exemplary partial semiconductor device in FIG. 6 with the remaining excessive conductive plug removed.

Referring now to FIG. 7, following the completion of step 114, the partial semiconductor device, now designated with the reference numeral 700, is removed from Platen 1 by the robot arm 102 (FIG. 1a). In some embodiments, an optional deionized water rinse or similar wet clean may be performed on the partial semiconductor device 700 in a station located between Platen 1 and Platen 2. Further, to eliminate slurry cross-contamination, an optional platen rinse may be performed for the first and second platens. The semiconductor device 700 is then placed on Platen 2.

At step 116, the remaining excessive conductive plug 502 is removed using a second slurry. In one example, the second slurry may include alumina, silica, or any other suitable material suspended in an aqueous solution, such as alkaline or any other suitable solution, and may include any suitable concentration known in the art.

In some embodiments, a slower polishing operation may be employed for step 116 than was used at step 114. For example, a polishing pressure of between roughly 0.2 psi to roughly 8 psi is applied between the partial semiconductor device 700 and Platen 2. The platen rotational speed may be between approximately 5 RPM to approximately 300 RPM, and the second slurry may be distributed onto the second platen at the speed of between about 20 ml/min to about 700 ml/min. However, each of the platen rotational speed and slurry distribution speed may be lowered to accommodate the slower polishing operation of step 116. In one example, endpoint detection may be utilized to measure the reflectivity of the partial semiconductor device 600. As the conductive plug 502 is removed over time to expose an underlying portion of the barrier layer 410, the reflectivity from the surface of the partial semiconductor device 600 will change accordingly. Upon the detection of such a change, the polishing step 114 may be terminated. Alternatively, a timer with a suitable duration may be utilized to monitor the completion of this polishing operation.

In one embodiment, step 116 continues to remove at least a portion of the excessive barrier layer 410, which may include Ta, to a level 702. This continuation of step 116 may be performed on the same Platen 2 but with a different slurry (if desired). Here, the different slurry may be substantially different from the slurry previously used on Platen 2. In one example, the different slurry may include alumina, silica, or any other suitable material suspended in an aqueous solution, such as alkaline or any other suitable solution, and may include any suitable concentration known in the art.

This continuation of step 116 may employ the same polishing pressure, platen rotational speed, and slurry dispensing speed. On the other hand, any of those three parameters may be adjusted to suit the purposes of removing the barrier layer 410. In one example, endpoint detection or a timer may be utilized to detect the completion of step 116. Generally, following the completion of step 116, the removed barrier layer 410 may have a thickness of between approximately 10 Angstroms to 300 Angstroms.

Figure 8:
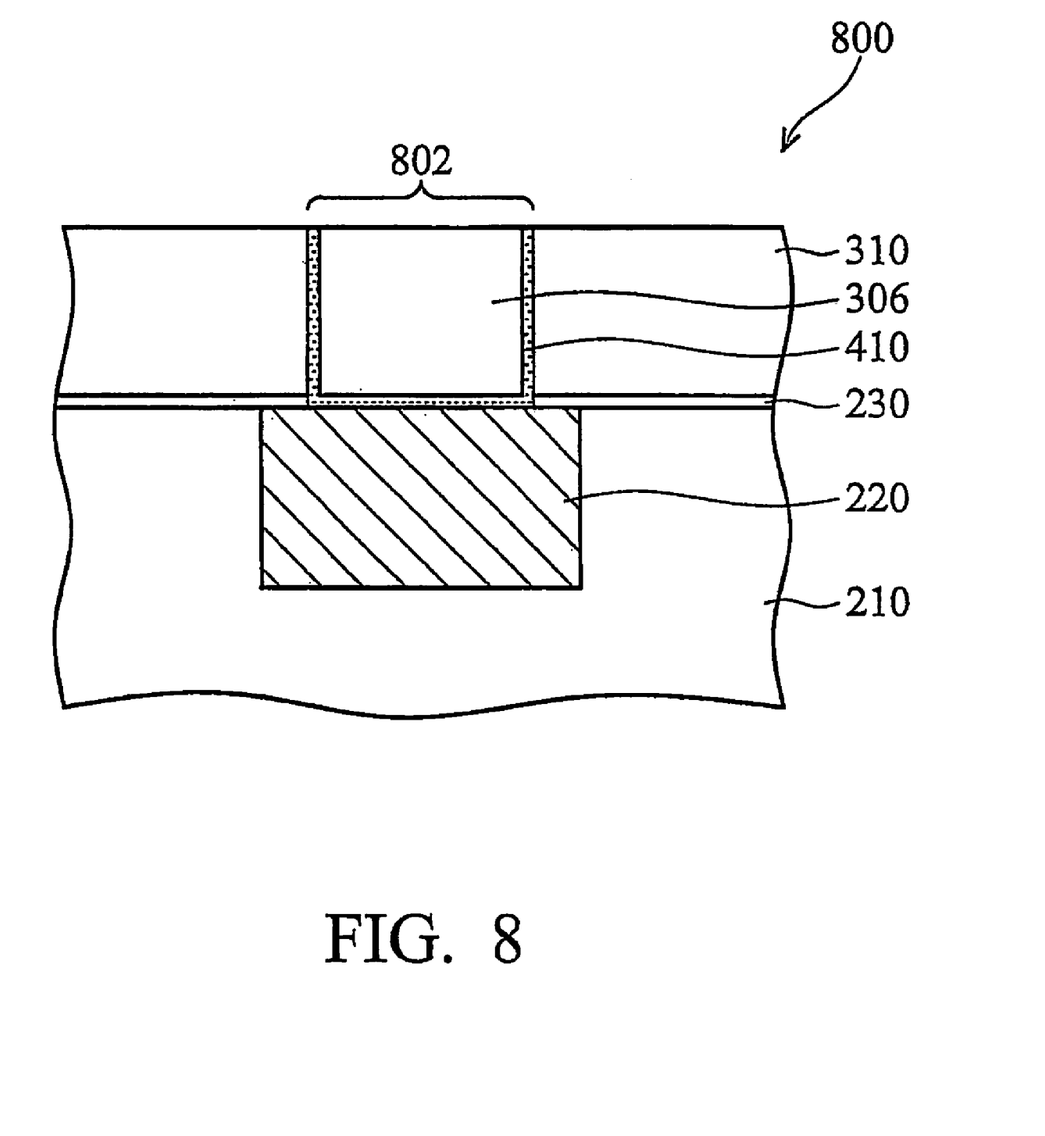
FIG. 8 is a cross-sectional view of the exemplary partial semiconductor device in FIG. 7 with a complete interconnect.

Referring now to FIG. 8, following the completion of step 116, the partial semiconductor device, now designated with the reference numeral 800, is removed from Platen 2 by the robot arm 102 (FIG. 1a). An optional de-ionized water rinse or similar wet clean may be performed on the partial semiconductor device 800 in a station located between Platens 2 and 3. Further, to eliminate slurry cross-contamination, an optional platen rinse may also be performed for the second and third platens.

At step 118, the partial semiconductor device 800 is placed onto Platen 3 with a different slurry, which may be substantially similar to, identical to, or different from one or more of the previous slurries. In one example, the slurry may include alumina, silica, or any other suitable material suspended in an aqueous solution, such as alkaline or any other suitable solution, and may include any suitable concentration known in the art.

The polishing pressure for step 118 may be between approximately 0.2 psi and approximately 10 psi, while the third platen may be rotated at a speed of between about 5 RPM and about 300 RPM. In addition, the fourth slurry may be distributed at a speed of between approximately 30 ml/min to 700 ml/min. Generally, step 118 is a timed polishing process that may last between roughly 30 seconds and roughly 2 minutes. However, other polishing durations are also contemplated. Again, endpoint detection may alternatively be employed to monitor the termination of step 118. As a result, an interconnect 802 is completed on the partial semiconductor device 800.

Following step 118, an optional wafer rinse and platen rinse may be performed during the unloading of the partial semiconductor device 800 from the CMP system. Thereafter, additional steps are adopted for forming a complete semiconductor device. Since those additional steps are known in the art, they will not be further described herein.

It is contemplated that many variations may be utilized for performing the above steps. In one example, instead of Cu, the conductive plug 502 may include a variety of other materials, such as copper alloy, refractory metal, $TiSi_2$, CoSi$_2$, NiSi, PtSi, W, WSi$_2$, metal silicide, TiN, iW, TaN, Al, AlCu, aluminum, aluminum alloy, tungsten, and/or other suitable materials. In a second example, instead of Ta, the barrier layer 410 may include a variety of other materials, such as TaN, Ti, TiN, and/or other barrier materials. In a third example, the semiconductor device 200 can include a connection structure that is utilized for connecting interconnect layers, an interconnect layer and a substrate, an interconnect layer and a gate, an active region and a gate, an active region and an interconnect layer, or serve other connection purposes. In a fourth example, the semiconductor device 200 can include a connection structure that is utilized to connect different semiconductor devices, such as a drain region of a first device and the gate of a second device, or a source region of a first device and the gate of a second device. Therefore, a variety of modifications is contemplated by this disclosure.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. A method for forming an interconnect structure of a semiconductor device utilizing a chemical-mechanical polishing (CMP) processing, comprising:
   removing a first portion of a first layer of interconnect materials using a first platen and a first slurry;
   removing a second portion of the first layer using a second platen and a second slurry;
   removing a first portion of a second layer of the interconnect materials using a second platen and a third slurry; and
   removing a second portion of the second layer using a third platen and a fourth slurry.

2. The method of claim 1 wherein the first layer comprises a conductive layer.

3. The method of claim 1 wherein the first layer comprises copper (Cu).

4. The method of claim 1 wherein the second layer comprises a barrier layer.

5. The method of claim 1 wherein the second layer comprises tantalum (Ta).

6. The method of claim 1 wherein the thickness of the first portion of the second layer is approximately 10 Angstroms.

7. The method of claim 1 wherein the thickness of the first portion of the second layer is approximately 300 Angstroms.

8. The method of claim 1 wherein the thickness of the first portion of the second layer is between approximately 10 Angstroms to approximately 300 Angstroms.

9. The method of claim 1 wherein removing a first portion of a second layer of the interconnect materials comprises a slower polishing operation than removing a second portion of the first layer.

10. The method of claim 9 wherein the slower polishing operation utilizes a polishing pressure of between about 0.2 psi to about 8 psi.

11. The method of claim 1 wherein the second slurry comprises silica.

12. The method of claim 1 wherein the third slurry comprises alumina.

13. The method of claim 9 wherein the slower polishing operation utilizes a lower platen rotation speed and a lower slurry dispensing speed.

14. The method of claim 1 wherein the fourth slurry comprises silica.

15. A method for forming an interconnect structure of a semiconductor device using a multi-platen chemical mechanical polishing (CMP) process, comprising:
   removing a first portion of a copper (Cu) layer of interconnect materials using a first platen and a first slurry;
   removing a second portion of the Cu layer using a second platen and a second slurry;
   removing a first portion of a tantalum (Ta) layer of the interconnect materials using a second platen and a third slurry, wherein the thickness of the first portion is between approximately 10 Angstroms to approximately 300 Angstroms; and
   removing a second portion of the Ta layer using a third platen and a fourth slurry.

16. The method of claim 15 wherein removing a first portion of a tantalum layer of the interconnect materials comprises a slower polishing operation than removing a second portion of the Cu layer.

17. The method of claim 16 wherein the slower polishing operation utilizes a polishing pressure of between about 0.2 psi to about 8 psi.

18. The method of claim 15 wherein the first slurry comprises silica.

19. The method of claim 15 wherein the second slurry comprises alumina.

20. A method for forming an interconnect structure of a semiconductor device utilizing a chemical-mechanical polishing (CMP) processing, comprising:
   removing a first portion of a first layer of interconnect materials using a first platen and a first slurry;
   removing a second portion of the first layer using a second platen and a second slurry;
   removing a first portion of a second layer of the interconnect materials using a second platen and a third slurry; and
   removing a second portion of the second layer using a third platen and the third slurry.

* * * * *